United States Patent [19]
Lang

[11] 3,808,506
[45] Apr. 30, 1974

[54] CONNECTOR ASSEMBLY FOR INTEGRATED CIRCUIT STACK

[76] Inventor: Jerome G. Lang, 3372 Lacoma Cir., Ann Arbor, Mich. 48104

[22] Filed: Mar. 26, 1973

[21] Appl. No.: 344,776

[52] U.S. Cl. ... 317/101 D, 317/101 CC, 339/17 CF
[51] Int. Cl. ... H05k 1/04
[58] Field of Search..... 339/17 LC, 17 C; 174/52 R, 174/52 S; 317/101 CC, 101 D, 101 DH

[56] References Cited

UNITED STATES PATENTS 2,189,874 2/1940 Ziganke ... 317/101 DH

Primary Examiner—David Smith, Jr.
Attorney, Agent, or Firm—Olsen and Stephenson

[57] ABSTRACT

A connector assembly for facilitating the electrical connecting of a stack of integrated circuit blocks. The assembly includes a retainer which supports the stack of functional electronic circuit packages and a cap which mounts on the base and carries a plurality of spring conductors which are arranged in a pattern corresponding to the pattern of the contacts on the functional blocks in the stack. When the cap is mounted on the base the conductors engage the contacts so that the conductors can then be wired to interconnect the circuit blocks.

4 Claims, 3 Drawing Figures

CONNECTOR ASSEMBLY FOR INTEGRATED CIRCUIT STACK

BACKGROUND OF THE INVENTION

The integrated circuit block enables the formation of a wide variety of complex electric circuits. However, in order to fully utilize the capabilities of the integrated circuit block, it has been found desirable to provide mechanisms enabling quick installation, removal and replacement of individual blocks. One of the principal objectives of this invention, therefore, is to provide an improved connector assembly facilitating installation, removal and replacement of integrated circuit blocks, as well as a balanced "line" impedance capability.

SUMMARY OF THE INVENTION

In the connector assembly of this invention, the integrated circuit stack is supported by a channeled support base, and covered and supported by a cap, at least one side wall of which contains metallic conductors which carry the signals from the stack to terminals on the exterior surface of the cap. The electrical contacts on the interior surface of the side wall are in the shape of springable feet which press against the metallic contact pads on the outer surface of each of the integrated circuit blocks. As the side walls of the cap are fastened to the base they are pressed against the integrated circuit blocks and the desired electrical contacts are made; the spring loading of these contacts insures maximum reliability.

The exterior surface of the side wall constitutes a wiring plane containing terminals which are electrically connected to each of the integrated circuit leads. These contacts can then be interconnected according to a predetermined plan with individual wires or with printed wires.

It is, therefore, an object of this invention to provide an improved connector assembly for integrated circuit elements which has reliable spring-loaded connections between the interior circuits and external circuitry with a balanced impedance capability or standard wires.

It is a further object to provide a wiring panel on one or two surfaces of the container, the terminals of which may be wired to interconnect the internal circuit elements with each other and with external components according to a predetermined plan.

It is still a further object of this invention to provide a connector assembly which facilitates the removal of individual circuit blocks by eliminating the tedious step of unwiring each circuit block.

Further objects, features and advantages of this invention will become apparent from a consideration of the following description, the appended claims, and the accompanying drawing in which:

DESCRIPTION OF THE PREFERRED EMBODIMENTS

Figures 1, 2, 3:
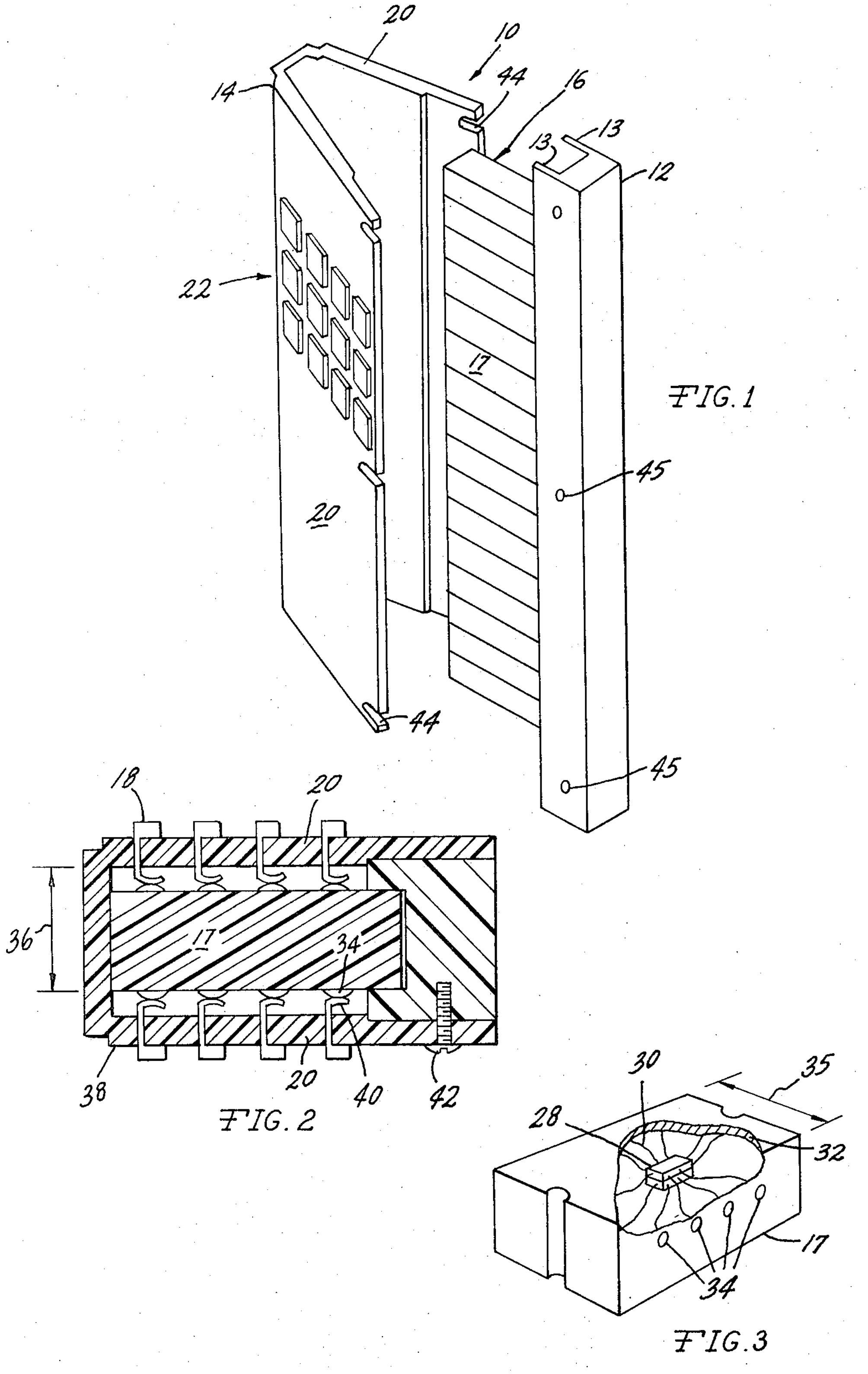
FIG. 1 is a perspective view of the connector assembly of this invention shown in open position being assembled with an electronic circuit stack.
FIG. 2 is a fragmentary cross sectional view of the connector assembly of this invention shown in closed position and illustrating the contacts between the integrated circuit blocks and the wiring plane.
FIG. 3 is a perspective view of an integrated circuit block with a portion broken away to illustrate the circuit components.

Referring now to the drawings, the connector assembly of this invention, indicated generally at 10, is illustrated in FIG. 1, as comprising a base 12, and a cap 14. The base 12 supports a stack 16 of circuit blocks 17 within the stack 16. The cap 14 fits over the stack 16 and is mounted on the base 12. Metallic conductors 18 carry the electronic signal through the side walls 20 of the cap 14 and form an array of terminals 22 on the outer surface of the side walls 20 of the cap 14. This array of terminals 22 facilitates the procedures and processes used to interconnect the various elements within the stack 16.

Each circuit block 17 includes two or more individual circuit elements 28. Leads, indicated generally at 30 carry the electronic signals from the circuit elements through the walls 32 of the circuit block and terminate in metallic contact pads 34 on the exterior surface.

In the assembly of the cap 14 with the base 12 as to interconnect the blocks 17 in the stack 16, first assume that the stack 16 is supported on the base 12 as shown in FIG. 1 with the blocks 17 retained between the spaced legs 13 in the base 12. The cap 14 is formed of an electrically nonconductive plastic material that has sufficient resilience to enable the legs 20 to be moved from their diverging unstressed position shown in FIG. 1 to their stressed substantially parallel positions shown in FIG. 2. This capability of the cap 14 facilitates rapid assembly with the base 12 since the cap 14 can be moved without interference into a covering relation with the stack 16 while the legs 20 are diverged. The legs 20 are then movable to their parallel positions shown in FIG. 2 and fasteners 42 are extended through slots 44 in the legs 20 into threaded openings 45 in the base 12. Each of the conductors 18 is formed integral with a spring contact 40 engageable with the contact pad 34 on a circuit block 17 in the assembled position of the cap 14 shown in FIG. 2. The spring construction of the contact 40 provides for a firm electrical contact thereof with a pad 34.

The cap 14 is dimensioned so that the distance between the legs 20, indicated at 36 in FIG. 2, is proportional to the width 35 of a circuit block 17. This provides for the final assembly arrangement shown in FIG. 2 in which the spring contacts 40 engage the contact pads 34. It is to be understood, however, that the cap 14 can be constructed with conductors 18 on one leg 20 even though illustrated on both legs 20 in the drawing.

In the assembled position of the cap 14 on the base 12, the conductor terminals 22 on the exterior surface of one leg 20 form a wiring plane that facilitates electrical interconnection of the circuit blocks 17. Electrical conductors (not shown) can be soldered to and extended between the terminals 22 according to a predetermined plan so as to achieve a desired interconnection of the blocks 17. If desired, the terminals 22 can be in the form of posts which can be inserted in the sockets on a printed wiring board or otherwise electrically connected. Wiring may also be printed on either or both planes.

What is claimed is:

1. A connector assembly for a stack of circuit blocks each of which contains electronic elements and has contact pads wired to the elements, said assembly comprising a base arranged in a supporting relation with said stack, and a cap mounted on said base, said cap having at least one side wall, a plurality of conductors mounted on and extending through said one side wall, each of said conductors having springable contact means on the inner end thereof and terminal means on the outer end thereof, said conductors being positioned so that said contact means makes electrical contact with the said contact pads on said circuit blocks.

2. A connector assembly set forth in claim 1 wherein said cap is generally U-shape having a pair of side walls which diverge when not stressed, said cap being formed of an electrically nonconductive material enabling springing of said side walls toward each other for mounting on said base.

3. A connector assembly according to claim 2 wherein said base is generally channel shape having spaced legs arranged on opposite sides of said blocks, and means on said legs for releasably mounting said cap side walls thereon.

4. A connector assembly as described in claim 1 wherein the exterior surface of said one side wall of said cap constitutes a wiring plane containing a plurality of said terminal means which are interconnectable so as to place the stacked internal circuit elements in a specific predetermined network.

* * * * *